United States Patent
Seo et al.

(10) Patent No.: US 7,782,416 B2
(45) Date of Patent: Aug. 24, 2010

(54) ARRAY SUBSTRATE FOR LIQUID CRYSTAL DISPLAY DEVICE USING ORGANIC SEMICONDUCTOR MATERIAL AND METHOD OF FABRICATING THE SAME

(75) Inventors: Hyun-Sik Seo, Gyeonggi (KR);
Nack-Bong Choi, Gyeonggi-do (KR);
Min-Joo Kim, Seoul (KR)

(73) Assignee: LG. Display Co., Ltd., Seoul (KR)

( * ) Notice: Subject to any disclaimer, the term of this patent is extended or adjusted under 35 U.S.C. 154(b) by 472 days.

(21) Appl. No.: 11/644,313

(22) Filed: Dec. 21, 2006

(65) Prior Publication Data
US 2007/0249122 A1 Oct. 25, 2007

(30) Foreign Application Priority Data
Apr. 20, 2006 (KR) .................. 10-2006-0035597
Jun. 23, 2006 (KR) .................. 10-2006-0056896

(51) Int. Cl.
*G02F 1/136* (2006.01)
(52) U.S. Cl. .............. 349/47; 438/30; 438/99; 438/161
(58) Field of Classification Search .......... 257/E29.137, 257/E21.535, E21.598, E51.006, E51.007; 345/42–43, 46–47; 438/30, 99, 161, 585, 438/704; 349/138
See application file for complete search history.

(56) References Cited
U.S. PATENT DOCUMENTS
2003/0059975 A1* 3/2003 Sirringhaus et al. ........... 438/99
2003/0071944 A1* 4/2003 Baek ........................ 349/113
2004/0201064 A1* 10/2004 Hirai et al. ................. 257/347
2004/0233359 A1* 11/2004 Nam et al. .................. 349/114
2005/0139924 A1* 6/2005 Kim et al. .................. 257/347
2005/0140890 A1* 6/2005 Kim et al. .................. 349/139

FOREIGN PATENT DOCUMENTS
CN 1462900 A 12/2003

OTHER PUBLICATIONS
Office Action issued in corresponding Chinese Patent Application No. 200610169488.6; issued Aug. 29, 2008.

* cited by examiner

*Primary Examiner*—Matthew C Landau
*Assistant Examiner*—Daren Wolverton
(74) *Attorney, Agent, or Firm*—Brinks Hofer Gilson & Lione

(57) ABSTRACT

An array substrate for a liquid crystal display device comprises a data line, source and drain electrodes disposed on a substrate; a pixel electrode disposed in a pixel region and contacting the drain electrode; an organic semiconductor layer disposed on the substrate; a gate insulating layer disposed on the substrate; a gate electrode disposed on the substrate; a first passivation layer of a photosensitive having a gate contact hole on the gate electrode, the gate contact hole exposing the gate electrode; and a gate line disposed on the first passivation layer, the gate line crossing the data line to define the pixel region and contacting the gate electrode through the gate contact hole, wherein the organic semiconductor layer, the gate insulating layer, and the gate electrode have a substantially same shape.

29 Claims, 19 Drawing Sheets

ARRAY SUBSTRATE FOR LIQUID CRYSTAL DISPLAY DEVICE USING ORGANIC SEMICONDUCTOR MATERIAL AND METHOD OF FABRICATING THE SAME

The present application claims the benefit of Korean Patent Application Nos. 2006-0035597 and 2006-0056896, filed in Korea on Apr. 20, 2006 and Jun. 23, 2006, respectively, both of which are herein incorporated by reference.

FIELD

The present invention relates to a liquid crystal display device, and more particularly, to an array substrate for a liquid crystal display device using an organic semiconductor material and a method of fabricating the same.

BACKGROUND

Since a liquid crystal display (LCD) device has characteristics of light weight, thinness and low power consumption, the LCD device has been widely used as a substitute for a display device of cathode-ray tube type. The LCD device includes first and second substrates that face each other. A liquid crystal layer is interposed between the first and second substrates. The LCD device uses optical anisotropy and polarization properties of liquid crystal molecules to display images. The LCD device includes a switching element, a pixel electrode, a common electrode, a color filter and so on. Particularly, the LCD device including a thin film transistor (TFT) as a switching element, referred to as an active matrix LCD (AM-LCD) device, has excellent characteristics of high resolution and displaying moving images.

FIG. 1 is an exploded perspective view of a conventional liquid crystal panel. As shown in FIG. 1, the liquid crystal panel includes an array substrate 10, a color filter substrate 20, and a liquid crystal layer 30. The array substrate 10 and the color filter substrate 20 face each other. The liquid crystal layer 30 is interposed therebetween.

The array substrate 10 includes a first substrate 12, a gate line 14, a data line 16, a thin film transistor (TFT) "T", and a pixel electrode 18. The gate and data lines 14 and 16 are formed on the first substrate 12 and cross each other to define a pixel region "P". The TFT "T" is formed at a crossing portion of the gate and data lines 14 and 16. The pixel electrode 18 is formed in the pixel region "P" and connected to the TFT "T".

The color filter substrate 20 includes a second substrate 22, a black matrix 25, a color filter layer 26, and a common electrode 28. The black matrix 25 is formed on the second substrate 22 and has a lattice shape. The black matrix 25 corresponds to a non-display region of the first substrate 12. The non-display region of the first substrate 12 includes the gate and data lines 14 and 16 and the TFT "T". The color filter layer 26 corresponds to the pixel region "P" and has one of red, green, and blue colors "R", "G", and "B". Namely, the color filter layer 26 includes red, green and blue color filter patterns 26a, 26b and 26c. The common electrode 28 is formed on the black matrix 25 and the color filter layer 28. The common electrode 28 generates an electric field with the pixel electrode 18 such that the liquid crystal layer 30 is driven by the electric field.

Though not shown, a seal pattern is formed along edges of the first and second substrates 12 and 22. The seal pattern prevents the liquid crystal layer 30 from overflowing. In addition, first and second alignment layers may be formed between the first substrate 12 and the liquid crystal layer 30 and between the second substrate 22 and the liquid crystal layer 30. A polarization plate may be formed on an outer surface of one of the first and second substrates 12 and 22. A backlight assembly is formed on a rear side of the first substrate 12 to apply light into the liquid crystal panel.

Generally, a glass plate is used for the first and second substrates 12 and 22. However, recently, a flexible plate, such as a plastic plate, is used for the first and second substrates 12 and 22 because the flexible plate is light and flexible. Unfortunately, since a process of fabricating an array substrate is performed under a temperature higher than about 200° C., it is very difficult for the flexible plate to be a substitute for the glass plate. So, the array substrate is made of the glass substrate, and the color filter substrate is made of the flexible substrate.

When processes of forming a metal layer, a gate insulating layer, a passivation layer are performed under a temperature lower than 200° C., a property of the TFT does not deteriorate. However, when a semiconductor layer is made of amorphous silicon under such a lower temperature, a property of the TFT does deteriorate. To resolve these problems, a method of fabricating the array substrate under a temperature lower than about 200° C. by forming the TFT using an organic semiconductor material is suggested.

FIG. 2 shows a process of fabricating a semiconductor layer using an organic semiconductor material and a shadow mask by evaporating. First, a gate electrode 52 and a gate line (not shown) are formed on a substrate 50 by depositing and patterning a metal layer (not shown). A gate insulating layer 53 is formed on the gate electrode 52 and the gate line (not shown) by depositing an organic insulating material. Next, a semiconductor layer 54 corresponding to the gate electrode 52 is formed on the gate insulating layer 53 by depositing and evaporating an organic semiconductor layer (not shown) using a shadow mask 56. In this case, there are limitations regarding a distance w1 between shadow mask patterns and a width w2 of the shadow mask patterns. For example, the shadow mask patterns should have the width w2 greater than 50 micrometers.

When the substrate is made of the glass plate, the semiconductor layer is formed by depositing and patterning silane ($SiH_4$) using a photoresist layer and a patterning mask. Silane is deposited by a method of chemical vapor deposition (CVD). However, it is difficult for the organic semiconductor material to be deposited and patterned by the above mentioned process. Since the organic semiconductor material is a powder type, it is difficult to deposit the organic semiconductor material by the CVD method. Moreover, when the organic semiconductor material contacts the photoresist layer including moisture and an acidic or basic liquid used to develop the photoresist layer, a property of the semiconductor layer deteriorates. Accordingly, the semiconductor layer of the organic semiconductor material is formed by evaporating using the shadow mask, instead of pattering using a patterning mask. However, as mentioned above, since there are some limitations regarding the shadow mask, it is difficult to produce the semiconductor layer used for the display device having a precision structure and a high resolution.

The organic semiconductor material is divided into a high molecular weight organic semiconductor material and a low molecular weight organic semiconductor material. Since the low molecular weight organic semiconductor material has better properties, it is used for the semiconductor layer as a substitute of the amorphous silicon. However, since the low molecular weight organic semiconductor material is only slightly soluble in an organic solvent and alcohol, it is difficult to convert the low molecular weight organic semiconductor material into a liquid phase.

To resolve these problems, the TFT of a bottom gate type is explained referring to FIG. 3. FIG. 3 is a cross-sectional view of an array substrate for an LCD device having an organic TFT of a bottom gate type and a bottom contact type.

First, the gate electrode 62 is formed on the substrate 60 by depositing and pattering a metallic material. And the gate insulating layer 63 is formed on the gate electrode 62. The source and drain electrodes 64 and 66 separating from each other are formed on the gate insulating layer 62. The source and drain electrodes 64 and 66 correspond to both ends of the gate electrode 62, respectively. Then, the low molecular weight organic semiconductor material layer (not shown) is evaporated to be deposited on the source and drain electrodes 64 and 66. The organic semiconductor layer 68 is formed on the source and drain electrode by patterning the low molecular weight organic semiconductor material layer (not shown). Since the low molecular weight organic semiconductor material layer (not shown) is formed on the uppermost layer of the TFT Tr, it is not exposed by the organic solvent and alcohol. Thus the TFT has a bottom gate type and a bottom contact type.

However, in the case of the bottom gate type and the bottom contact type, there is a high contact resistance. Accordingly, the TFT Tr has deteriorated properties.

Conversely, in the case of the bottom gate type and a top contact type, the TFT has preferable properties. However, since the low molecular weight organic semiconductor material is exposed by the organic solvent included in an etchant, it does not have suitable properties for the semiconductor layer.

As shown in FIG. 4, a method of fabricating the TFT of the bottom gate type and a top contact type is suggested to resolve the above-mentioned problem. As shown in FIG. 4, the gate electrode 72 and the gate insulating layer 73 are formed on the substrate 70. Then, the organic semiconductor layer 78, the source electrode 74 and the drain electrode 76 are formed on the gate insulating layer by using a shadow mask 80. However, a distance "d" between the source and drain electrodes 74 and 76, that is, a distance of a channel, is as large as several micrometers. Accordingly, a size of TFT Tr increases, and an aperture ratio and resolution of the LCD device are deteriorated.

SUMMARY

An array substrate for a liquid crystal display device comprises a data line disposed on a substrate that has a pixel region, and source and drain electrodes disposed on the substrate. The source electrode extends from the data line and is separated from the drain electrode. The array substrate for a liquid crystal display device further comprises a pixel electrode disposed in the pixel region, the pixel electrode contacting the drain electrode, an organic semiconductor layer disposed on the substrate, a gate insulating layer disposed on the substrate, and a gate electrode of a first metallic material disposed on the substrate. The array substrate for a liquid crystal display device also comprises a first passivation layer of a photosensitive organic insulating material that has a gate contact hole on the gate electrode, the gate contact hole exposing the gate electrode, and a gate line of a second metallic material disposed on the first passivation layer. The gate line crosses the data line to define the pixel region and contacts the gate electrode through the gate contact hole. The organic semiconductor layer, the gate insulating layer, and the gate electrode have a substantially same shape.

In another aspect of the present invention, a method of fabricating an array substrate for a liquid crystal display device comprises forming a data line, a source electrode, a drain electrode on a substrate that has a pixel region. The source electrode extends from the data line and is separated from the drain electrode. The method of fabricating an array substrate for a liquid crystal display device further comprises forming a pixel electrode in the pixel region that contacts the drain electrode, and forming an organic semiconductor layer, a gate insulating layer, and a gate electrode of a first metallic material on the substrate. The organic semiconductor layer, the gate insulating layer, and the gate electrode have a substantially same shape. The method of fabricating an array substrate for a liquid crystal display device also comprises forming a first passivation layer of a photosensitive organic insulating material that has a gate contact hole on the data line, wherein the gate contact hole exposes the gate electrode, and forming a gate line of a second metallic material on the first passivation layer. The gate line contacts the gate electrode through the gate contact hole and crosses the data line to define the pixel region.

In yet another aspect of the present invention, an array substrate for a liquid crystal display device comprises a data line disposed on a substrate that has a pixel region, and source and drain electrodes disposed on the substrate. The source electrode extends from the data line and is separated from the drain electrode. The array substrate for a liquid crystal display device further comprises a pixel electrode disposed in the pixel region. The pixel electrode contacts the drain electrode. The array substrate for a liquid crystal display device also comprises an organic semiconductor layer disposed on the substrate, a gate insulating layer disposed on the substrate, and a gate electrode that includes a first metal pattern on the gate insulating layer and a second metal pattern on the first metal pattern. The first and second metal patterns include different metallic materials. The array substrate for a liquid crystal display device further includes a first passivation layer of a photosensitive organic insulating material that has a gate contact hole on the gate electrode, the gate contact hole exposing the second metal pattern, and a gate line disposed on the first passivation layer. The gate line crosses the data line to define the pixel region and contacts the second metal pattern through the gate contact hole. The organic semiconductor layer, the gate insulating layer, the first metal pattern and the second metal pattern have a substantially same shape.

In further another aspect of the present invention, a method of fabricating an array substrate for a liquid crystal display device comprises forming a data line, a source electrode, a drain electrode on a substrate that has a pixel region. The source electrode extends from the data line and is separated from the drain electrode. The method of fabricating an array substrate for a liquid crystal display device further comprises forming a pixel electrode in the pixel region that contacts the drain electrode, and sequentially forming an organic semiconductor material layer, a gate insulating material layer, a first metal layer and a second metal layer on the substrate, the drain electrode and the pixel electrode. The first and second metal layers include different metallic materials. The method of fabricating an array substrate for a liquid crystal display device also comprises forming a first metal pattern by patterning the second metal layer, and forming a second metal pattern, the gate insulating layer and the organic semiconductor layer by a dry-etching process on the first metal layer. The gate insulating material layer and the organic semiconductor material layer are patterned using the first metal pattern as a patterning mask. The method of fabricating an array substrate for a liquid crystal display device further includes forming a first passivation layer that includes a gate contact hole on the first metal pattern, the gate contact hole exposing the first metal pattern, and forming a gate line on the first passivation layer. The gate line contacts the first metal pattern through the gate contact hole and crosses the data line to define the pixel region.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

Reference will now be made in detail to the preferred embodiments, examples of which are illustrated in the accompanying drawings.

Figure 5:
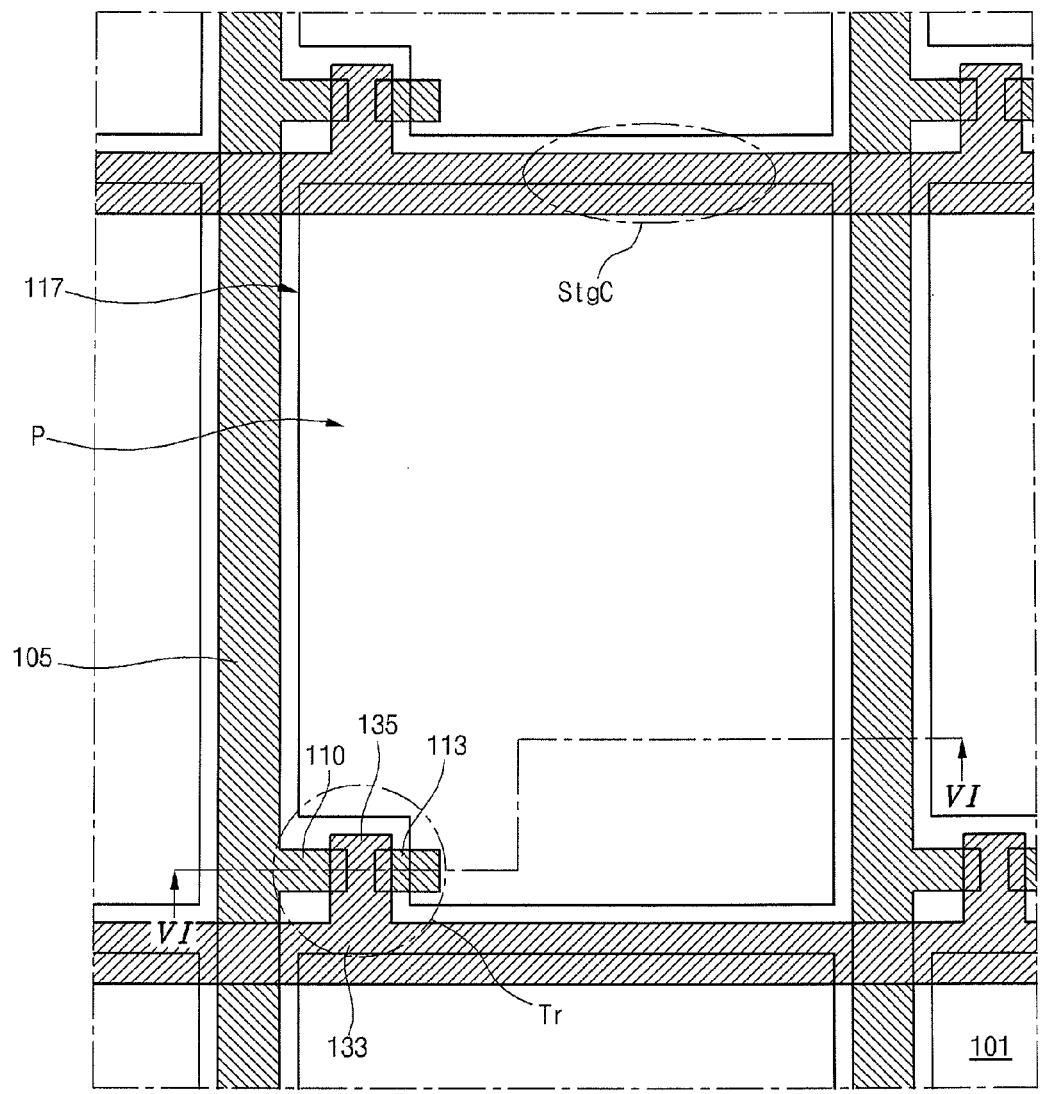
FIG. 5 is a plane view illustrating a pixel region of an array substrate for an LCD device having an organic semiconductor layer according to one embodiment of the present invention.

FIG. 5 is a plane view illustrating a pixel region of an array substrate for an LCD device having an organic semiconductor layer according to one embodiment of the present invention.

As shown in FIG. 5, a gate line 133, a data line 105, a thin film transistor (TFT) "Tr", a pixel electrode 117 and a storage capacitor "StgC" are formed on a substrate 101. The gate and data lines 133 and 105 cross each other to define a pixel region "P" on the substrate 101. The TFT "Tr" is formed at a crossing portion of the gate and data lines 133 and 105 and includes a gate electrode 135, a source electrode 110, a drain electrode 113, and so on. The source electrode 110 extends from the data line 105, and the drain electrode 113 is separated from the source electrode 110. The gate electrode 135 extends from the gate line 133 and partially overlaps the source and drain electrodes 110 and 113. A semiconductor layer of an organic semiconductor material (not shown) is formed below the gate electrode 135 and gate line 133. The pixel electrode 117 is formed in the pixel region "P" and connected to the drain electrode 113. The pixel electrode 117 overlaps the gate line 133 such that the storage capacitor "StgC" is formed on the substrate 101.

Figure 6:
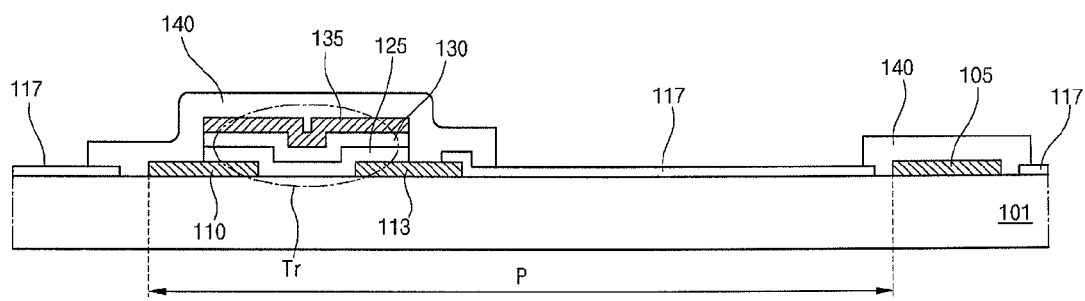
FIG. 6 is a cross-sectional view of a portion taken along the line VI-VI of FIG. 5.

FIG. 6 is a cross-sectional view of a portion taken along the line VI-VI of FIG. 5. As shown, the TFT "Tr" and the pixel electrode 117 are formed on the substrate 101. First, the data line 105 and the source and drain electrodes 110 and 113 are formed on the substrate 101 by depositing and patterning a first metal layer (not shown). The source and drain electrodes 110 and 113 are formed of a same material as the data line 105 and separated from each other. The source electrode 110 extends from the data line 133. The pixel electrode 117 is formed on the substrate 101 by depositing and patterning a transparent conductive metal layer (not shown). The pixel electrode 117 is formed in the pixel region "P". The pixel electrode 117 is connected to the drain electrode 113.

Figure 1:
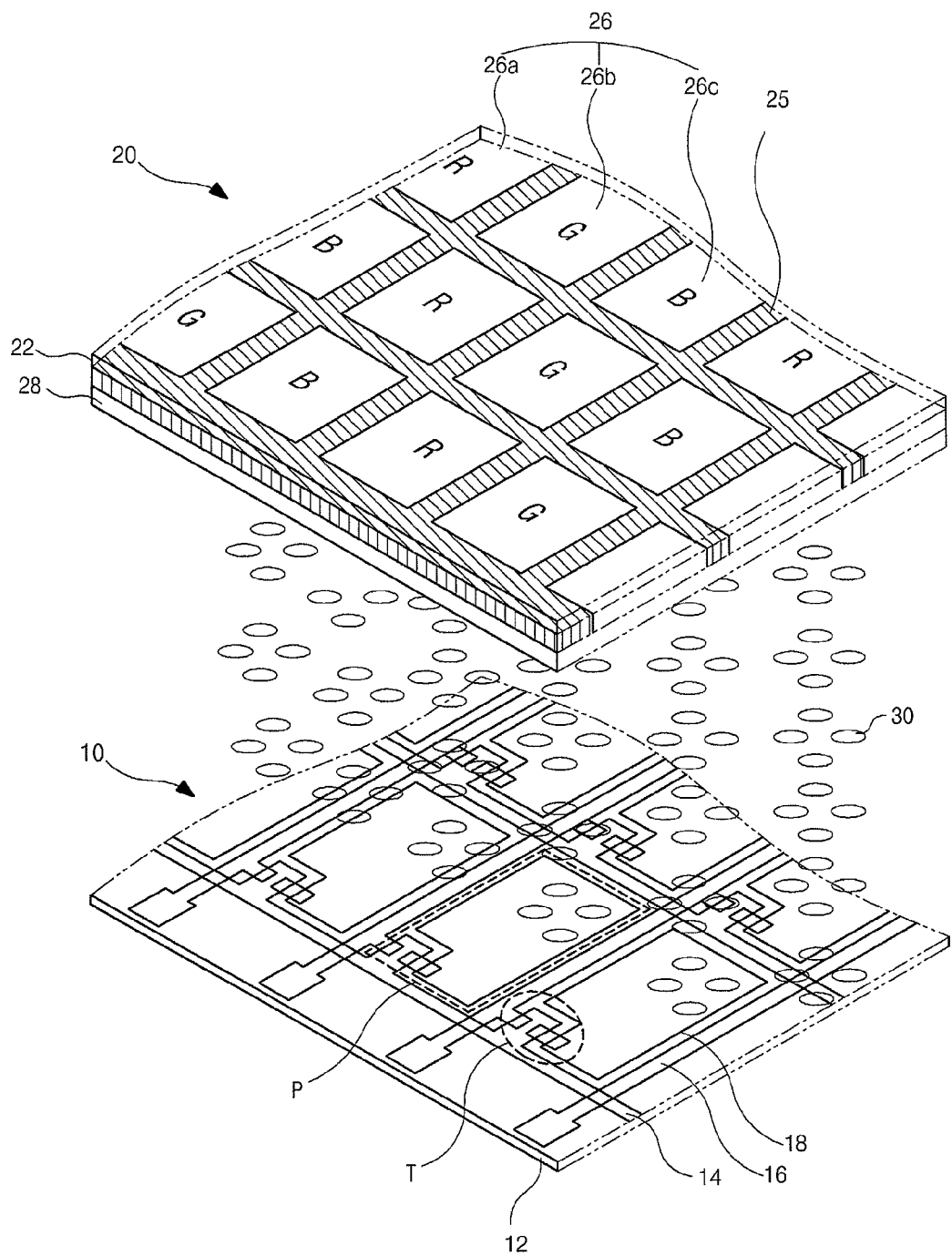
FIG. 1 is an exploded perspective view of a conventional LCD device.
Figure 2:
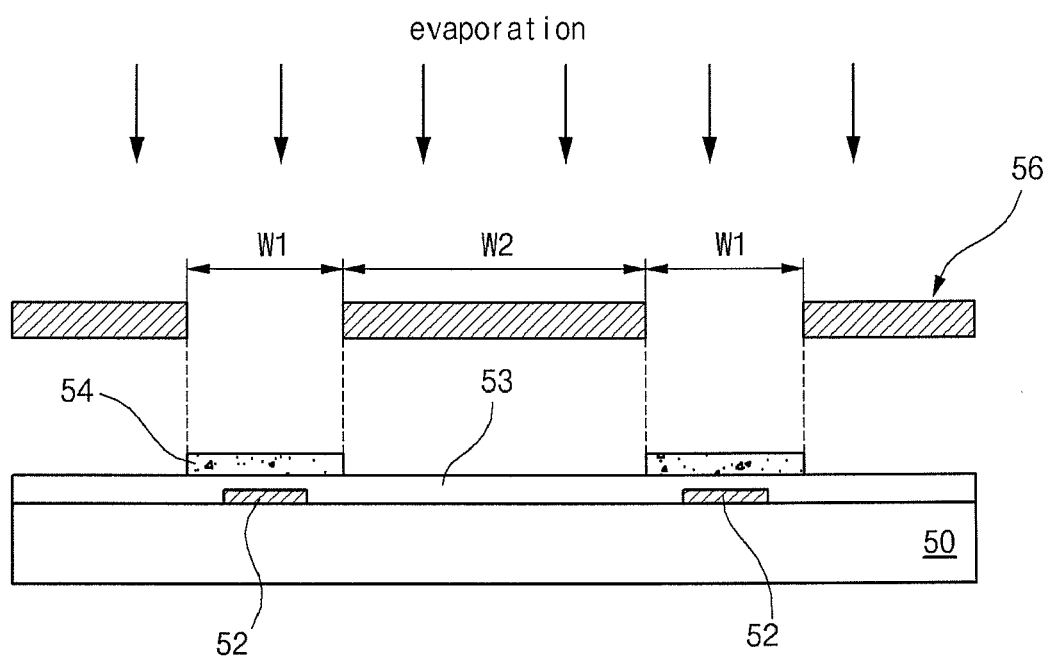
FIG. 2 illustrates a process of fabricating a semiconductor layer of an organic semiconductor material using a shadow mask by evaporating according to the related art.
Figure 3:
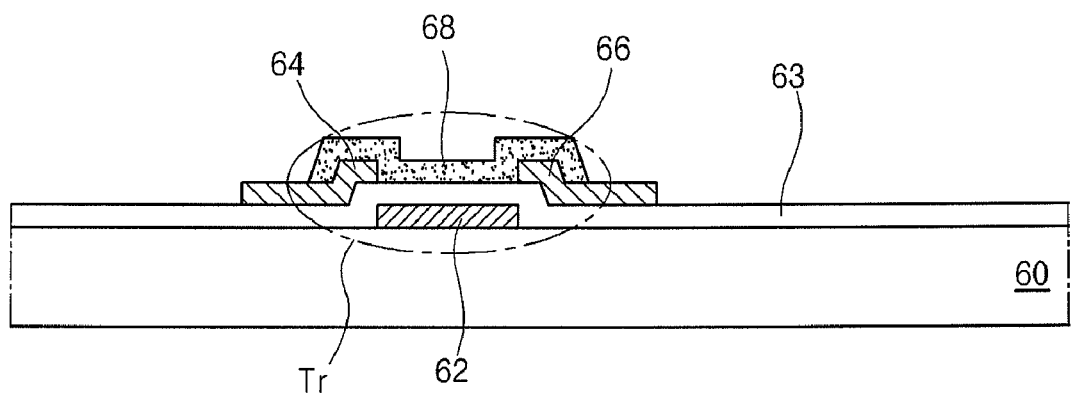
FIG. 3 is a cross-sectional view of an array substrate for an LCD device having an organic TFT of a bottom gate type and a bottom contact type.
Figure 4:
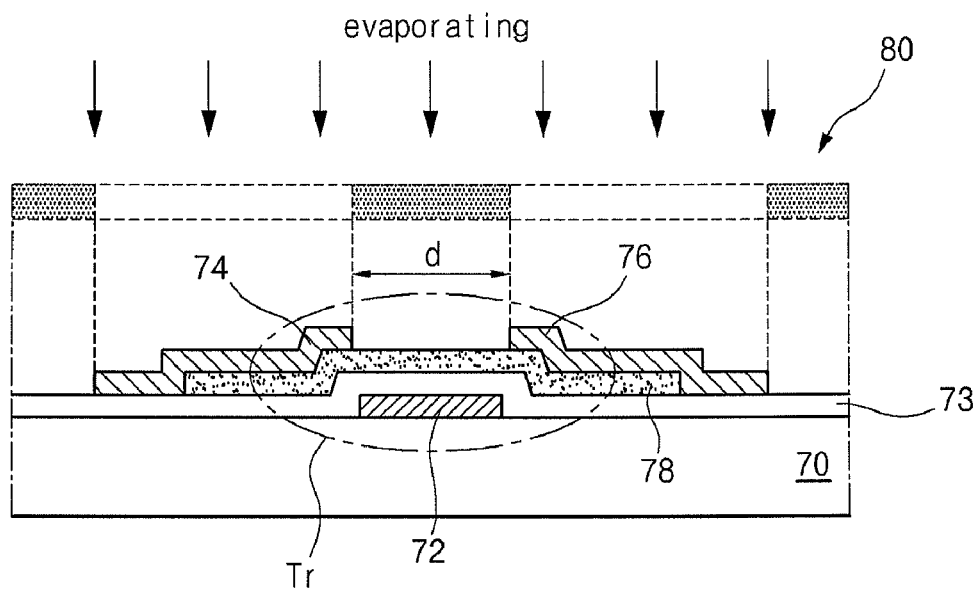
FIG. 4 is a cross-sectional view of an array substrate for an LCD device having an organic TFT of a bottom gate type and a top contact type.

Next, an organic semiconductor layer 125 of the organic semiconductor material is formed on the source and drain electrodes 110 and 113, and a gate insulating layer 130 of an organic insulating material is formed on the organic semiconductor layer 125. The gate electrode 135 is formed on the gate insulating layer 130. The gate electrode 135 includes one of molybdenum (Mo), Chromium (Cr), Mo—Cr alloy, and so on. It is possible to pattern them by dry etching. At the same time, the gate line 133 (of FIG. 5) crossing the data line 105 is formed on the substrate 101. In this case, since the organic semiconductor layer 125, the gate insulating layer 130, and the gate electrode 135 are sequentially patterned using a patterning mask, they have a same shape. In other words, ends of the organic semiconductor layer 125, the gate insulating layer 130, and the gate electrode 135 are aligned. Though not shown, the gate line similarly has a same shape as an organic semiconductor pattern and a gate insulating pattern below the gate line. Finally, a passivation layer 140 is formed on the gate line 133 (of FIG. 3) and gate electrode 135 by depositing and patterning an organic insulating material layer (not shown). The passivation layer 140 exposes the pixel electrode 117.

According to one embodiment of the present invention, the TFT "Tr" has a top gate structure, in which the gate electrode 135 is formed over the organic semiconductor layer 125. It is possible to sequentially pattern the gate electrode 135, the gate insulating layer 130, and the organic semiconductor layer 125 by the dry etching. Accordingly, since the organic semiconductor layer 125 is not exposed to etchant, the organic semiconductor layer 125 does not deteriorate. Moreover, since the organic semiconductor layer 125 is formed by a mask process, it is possible to use the organic semiconductor layer 125 for the display device having a precision structure.

FIGS. 7A to 7E are cross-sectional view illustrating a process of fabricating a TFT having an organic semiconductor pattern in the switching region without causing damage to the organic semiconductor pattern according to one embodiment of the present invention.

Figure 7A:
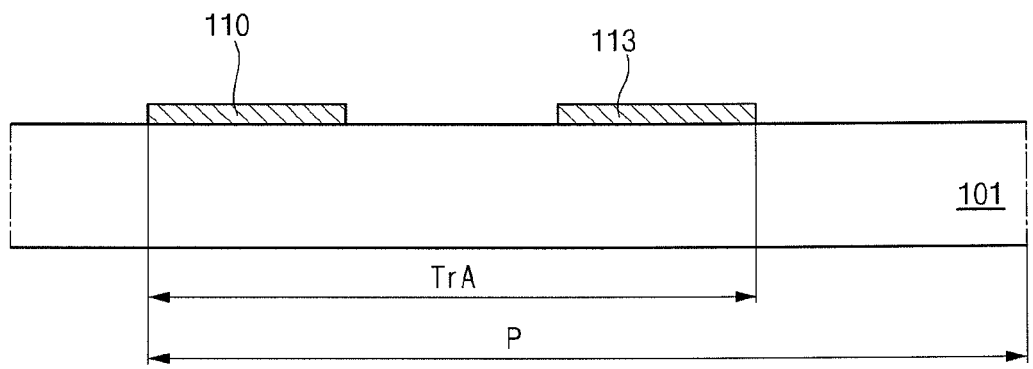
FIGS. 7A to 7E are cross-sectional view illustrating a process of fabricating a TFT having an organic semiconductor pattern in the switching region without causing damage to the organic semiconductor pattern according to one embodiment of the present invention.
Figure 14:
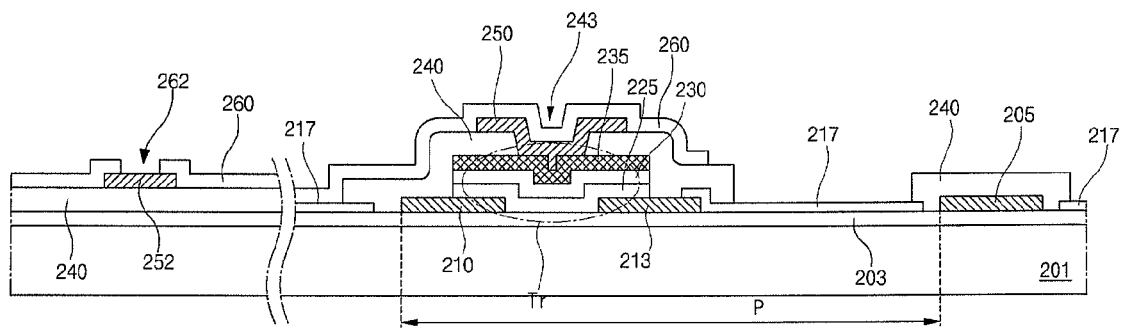
FIG. 14 is a cross-sectional view of an array substrate for an LCD device according to an embodiment of the present invention.

First, a buffer layer (not shown) is preferably formed on the substrate by depositing an inorganic material. The inorganic material has a hydrophilic property and a good adhesive property to the substrate. The inorganic material may include silicon oxide. Although the buffer layer is not shown in FIG. 7A, FIG. 14 shows the buffer layer 203. The buffer layer 203 is formed directly on the substrate 201.

Next, as shown in FIG. 7A, the source and drain electrodes 110 and 113 are formed on the substrate 101 by depositing and patterning a first metal layer (not shown). The substrate 101 includes the pixel region "P" and the switching region "TrA" in the pixel region "P". The source and drain electrodes 110 and 113 are formed on the switching region "TrA" and separated from each other. The first metal layer (not shown) includes a low resistant metallic material, such as gold (Au), copper (Cu), copper alloy, aluminum (Al), aluminum alloy (AlNd) and so on. At the same time, the data line (not shown) is formed on the substrate 101. The source electrode 110 extends from the data line (not shown).

Figure 7B:
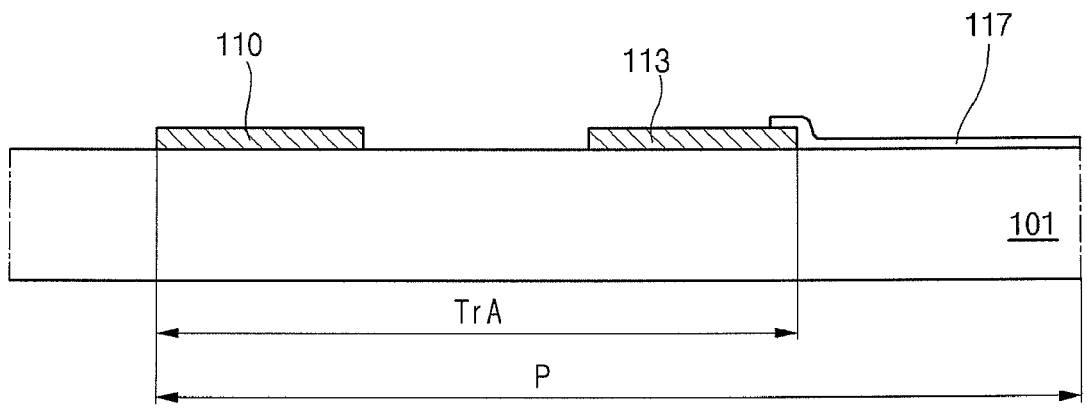

Next, as shown in FIG. 7B, the pixel electrode 117 is formed on the substrate 101 in the pixel region "P" by depositing and pattering the transparent conductive material, such as ITO and IZO. The pixel electrode 117 directly contacts the drain electrode 113.

Figure 7C:
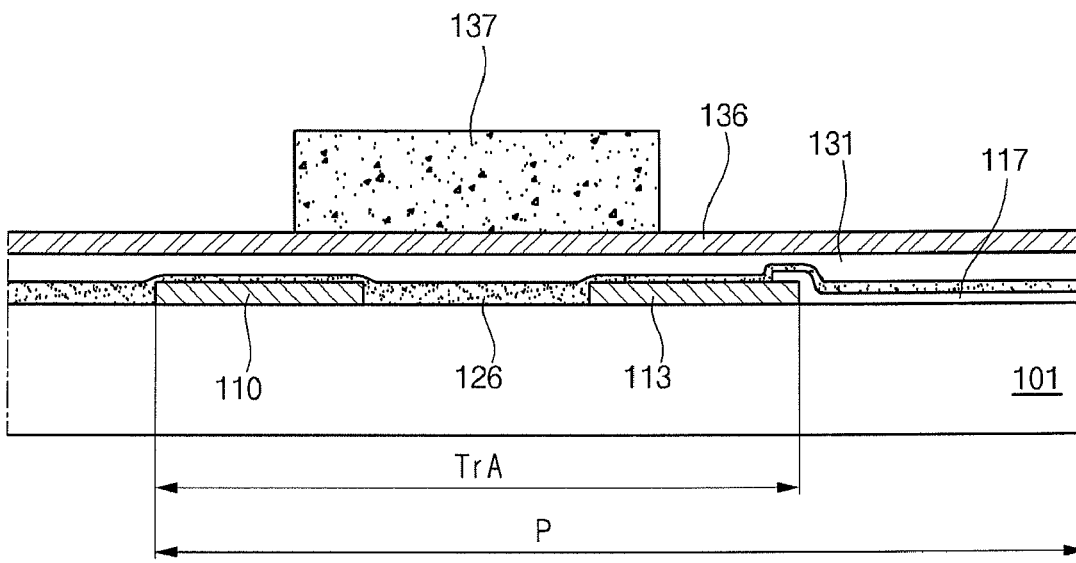

Next, as shown in FIG. 7C, the organic semiconductor material layer 126 is formed on the substrate 101 including the source and drain electrodes 110 and 113, the data line (not shown) and the pixel electrode 117 by depositing the organic semiconductor material of a liquid phase. The organic semiconductor material may be a low molecular organic semiconductor material having a good mobility, such as pentacene and polythiophene. The organic semiconductor material is deposited by using one of an ink-jet device, a nozzle coating device, a bar coating device, a slit coating device, a spin coating device, a printing device and so on.

The gate insulating material layer 131 of the organic insulating material, such as polyvinylalcohol and fluoropolymer, and a second metal layer 136 are sequentially formed on the organic semiconductor material layer 126. The second metal layer 136 includes a second metallic material, such as Mo and Cr. The second metallic material has a dry-etchable property.

Next, a photoresist (PR) pattern 137 is formed on the second metal layer 136 by depositing and patterning a PR layer (not shown). The PR layer (not shown) has a photosensitive property. The PR pattern 137 corresponds to a center of the switching region "TrA". In other words, the PR pattern 137 corresponds to a region between the source and drain electrodes 110 and 113, a part of the source electrode 110 and a part of the drain electrode 113.

Figure 7D:
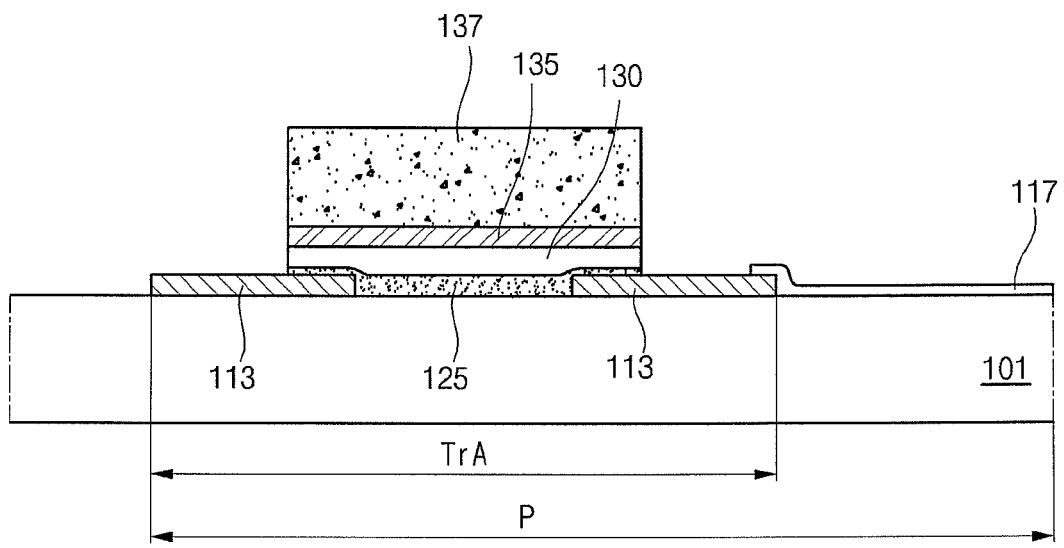

Next, as shown in FIG. 7D, the second metal layer 136 (of FIG. 7C) exposed by the PR pattern 137, the gate insulating material layer 131 (of FIG. 7C) and the organic semiconductor layer 126 (of FIG. 7C) are sequentially removed by a dry etching process using the PR pattern 137 as a mask. As a result, the organic semiconductor layer 125, the gate insulating layer 130 and the gate electrode 135 are sequentially formed on the source and drain electrodes 110 and 113 in the switching region "TrA". The organic semiconductor layer 125 contacts the source and drain electrodes 110 and 113. The data line (not shown) and the pixel electrode 117 are exposed by removing the organic semiconductor layer 125, the gate insulating layer 130 and the gate electrode 135. At the same time, the gate line (not shown) is formed from the second metal layer 136 (of FIG. 7C). The gate electrode 135 extends from the gate line (not shown). The gate line (not shown) crosses the data line (not shown) such that the pixel region "P" is defined on the substrate 101. A gate insulating material pattern (not shown), which is formed of a same layer and with a same material as the gate insulating layer 130, and an organic semiconductor material pattern, which is formed of a same layer and with a same material as the organic semiconductor layer 125, are formed between the gate line (not shown) and the substrate 101.

Figure 7E:
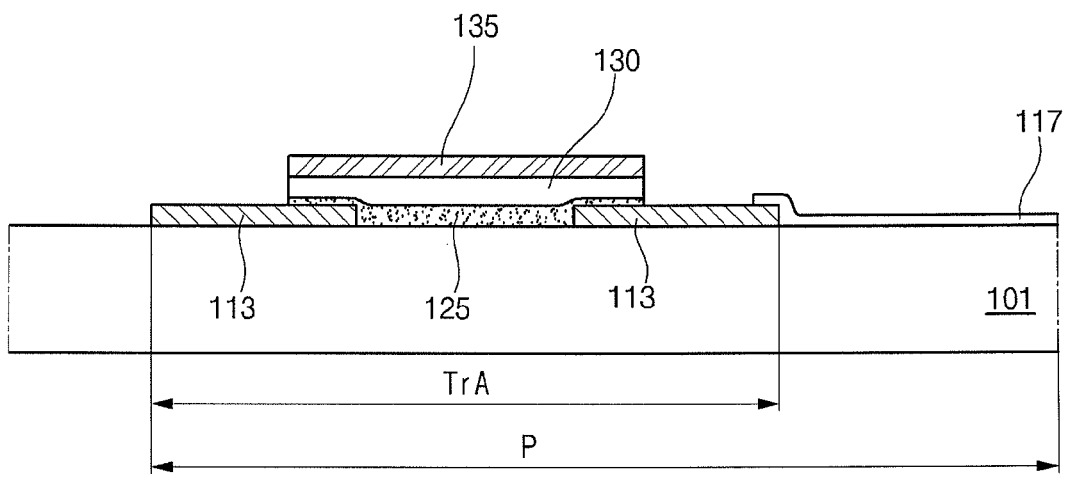

Next, as shown in FIG. 7E, the PR pattern 137 (of FIG. 7D) is removed such that the array substrate for the LCD device having the organic semiconductor layer is manufactured. Additional passivation layer (not shown) may be formed on the gate electrode 135 and the gate line (not shown).

Since the organic semiconductor material pattern of a same material as the organic semiconductor layer is located below the gate line, there is a problem of current leakage in the TFT.

Figure 8:
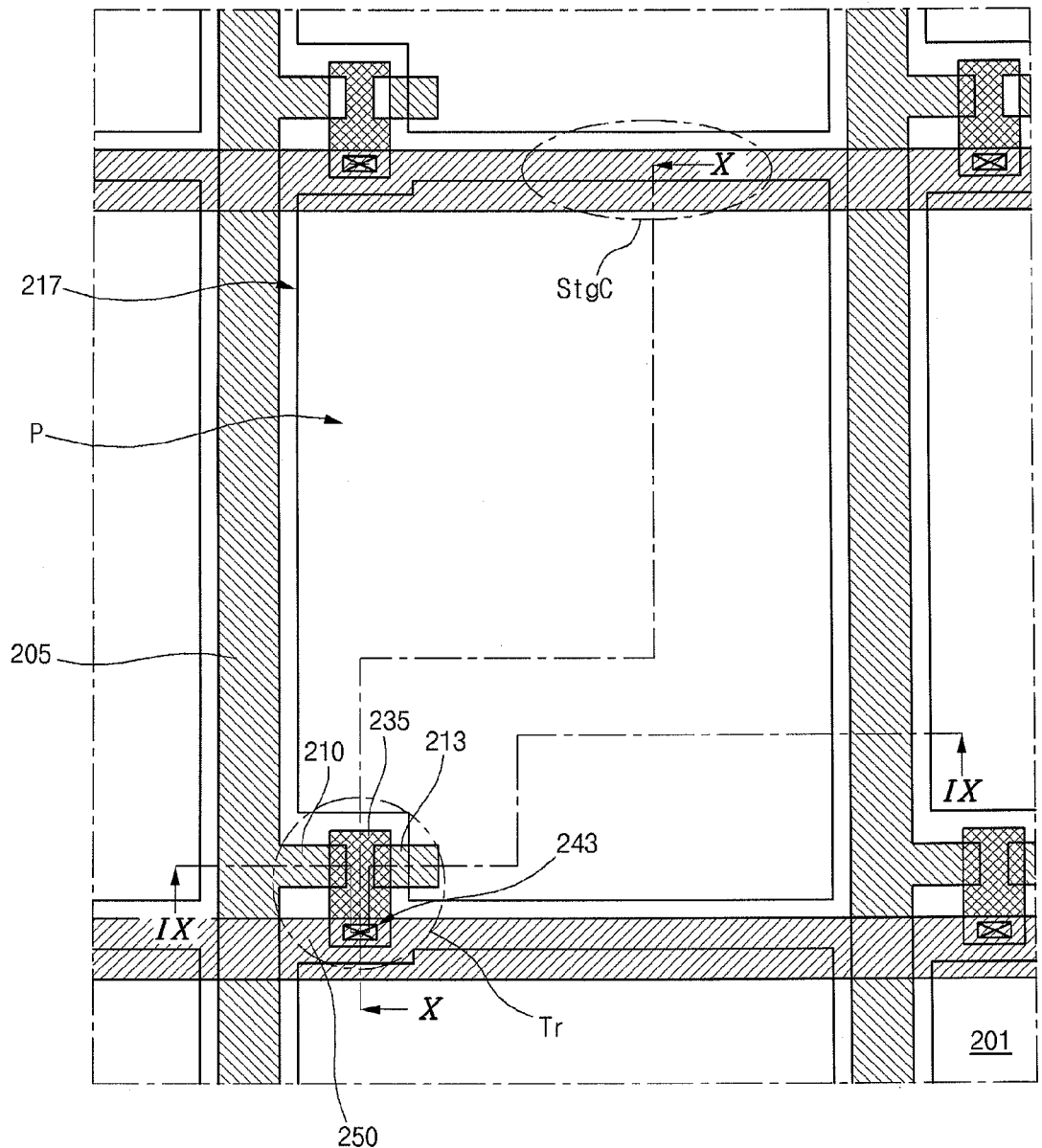
FIG. 8 is a plane view illustrating a pixel region of an array substrate for an LCD device having an organic semiconductor layer according to one embodiment of the present invention.

FIG. 8 is a plane view illustrating a pixel region of an array substrate for an LCD device having an organic semiconductor layer according to one embodiment of the present invention. As shown in FIG. 8, a gate line 250, a data line 205, a TFT "Tr", a pixel electrode 217, and a storage capacitor "StgC" are formed on a substrate 201. The substrate 201 may be a flexible substrate such as a plastic plate. The gate and data lines 250 and 205 cross each other to define a pixel region "P" on the substrate 201. The TFT "Tr" is formed at a crossing portion of the gate and data lines 250 and 205 and includes a gate electrode 235, a source electrode 210, a drain electrode 213, and so on. The source electrode 210 extends from the data line 205, and the drain electrode 213 is separated from the source electrode 210. The gate electrode 235 partially overlaps the source and drain electrodes 210 and 213 and is electrically connected to the gate line 250 through a gate contact hole 243.

The gate electrode 235 and the gate line 250 are formed of a different layer from each other. Since the organic semiconductor pattern is not formed below the gate line, a current leakage from the organic semiconductor pattern does not occur and a property of the TFT improves.

A gate insulating layer (not shown) of an organic insulating material and an organic semiconductor layer are formed below the gate electrode 235. The pixel electrode 217 is formed in the pixel region "P" and contacts the drain electrode 213. The pixel electrode 217 overlaps the gate line 250 such that the storage capacitor "StgC" is formed on the substrate 201.

Figure 9:
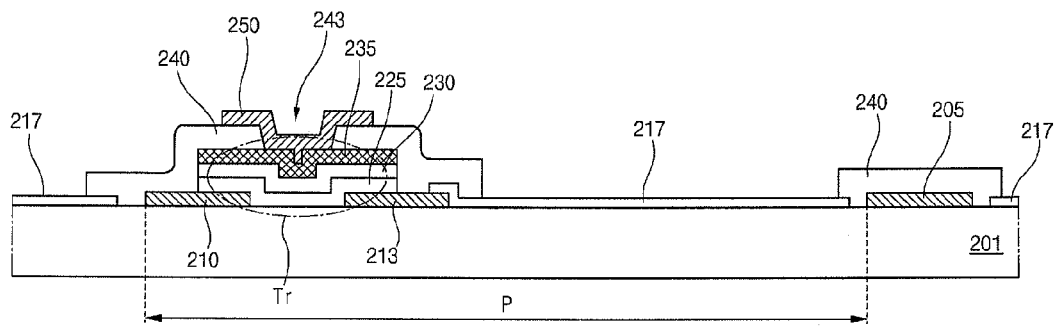
FIG. 9 is a cross-sectional view of a portion taken along the line IX-IX of FIG. 8.
Figure 10:
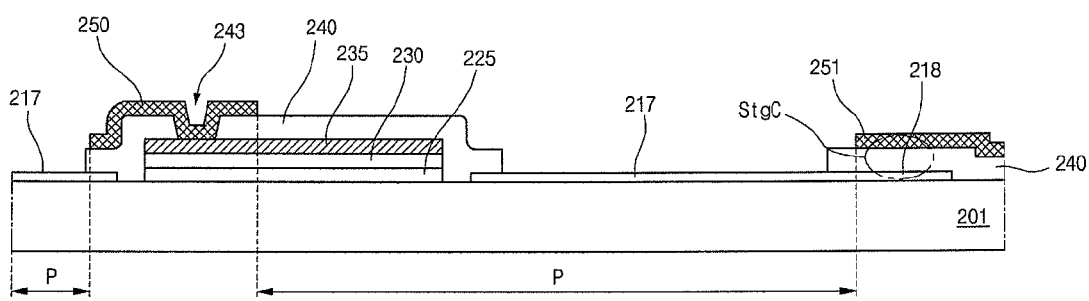
FIG. 10 is a cross-sectional view of a portion taken along the line X-X of FIG. 8.

FIGS. 9 and 10 are cross-sectional views taken along the lines IX-IX and X-X of FIG. 8, respectively.

As shown in FIGS. 9 and 10, the data line 205 and the source and drain electrodes 210 and 213 are formed on the substrate 201 by depositing and patterning a first metal layer (not shown). The data line 205 is formed of a same material as the source and drain electrodes 210 and 213. The source electrode 205 extends from the data line 205, and the drain electrode 213 is separated from the source electrode 210. The pixel electrode 217 is formed on the substrate 201 by depositing and patterning a transparent conductive metal layer (not shown). The pixel electrode 217 is formed in the pixel region "P". The pixel electrode 217 is connected to the drain electrode 213.

Next, an organic semiconductor layer 225 of the organic semiconductor material is formed on the source and drain electrodes 210 and 213, and a gate insulating layer 230 of an organic insulating material is formed on the organic semiconductor layer 225. The gate electrode 235 is formed on the gate insulating layer 230. The gate electrode 235 includes one of molybdenum (Mo), Chromium (Cr), Mo—Cr alloy, and so on. It is possible to pattern them by dry etching. Since the organic semiconductor layer 225, the gate insulating layer 230, and the gate electrode 235 are sequentially patterned using a patterning mask, they have a same shape. In other words, ends of the organic semiconductor layer 225, the gate insulating layer 230, and the gate electrode 235 are aligned. A passivation layer 240 of an organic insulating material is formed on the gate electrode 235. The passivation layer 240 includes a gate contact hole 243 that partially exposes the gate electrode 235. The pixel electrode 217 is exposed through the passivation layer 240.

Finally, the gate line 250 is formed on the passivation layer 240 by depositing and patterning a low resistance metal layer. The low resistance metal layer includes one of aluminum (Al), aluminum alloy (AlNd), copper (Cu), and so on. The gate line 250 is electrically connected to the gate electrode 235 through the gate contact hole 243 and crosses the data line 205 to define the pixel region "P". The gate line 250 partially overlaps the pixel electrode such that the storage capacitor "StgC" is formed on the substrate 201. The storage capacitor "StgC" includes the pixel electrode 217 as a first storage electrode 218, the passivation layer 240 as a dielectric substance, and the gate line 250 as a second storage electrode 251.

The TFT "Tr" has a top gate structure, in which the gate electrode 235 is formed over the organic semiconductor layer 225. It is possible to sequentially pattern the gate electrode 235, the gate insulating layer 230, and the organic semiconductor layer 225 by dry etching. Since the organic semiconductor layer 225 is not exposed to an etchant, the organic semiconductor layer 225 does not deteriorate. Moreover, since the organic semiconductor layer 225 is formed by a mask process, it is possible to use the organic semiconductor layer 225 for the display device having a precision structure. Moreover, since the gate line 250 is formed of the low resistance metallic material at a different layer from the gate electrode 235, a problem of signal delay resulted from a relatively high resistance material does not occur.

FIGS. 11A to 11F are cross-sectional views illustrating processes of fabricating a portion of an array substrate shown in FIG. 9, and FIGS. 12A to 12F are cross-sectional views illustrating processes of fabricating a portion of an array substrate shown in FIG. 10.

Figure 11A:
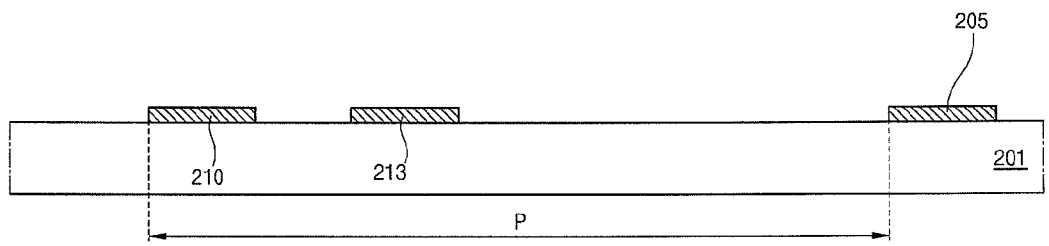
FIGS. 11A to 11F are cross-sectional views illustrating processes of fabricating a portion of an array substrate shown in FIG. 9.
Figure 12A:
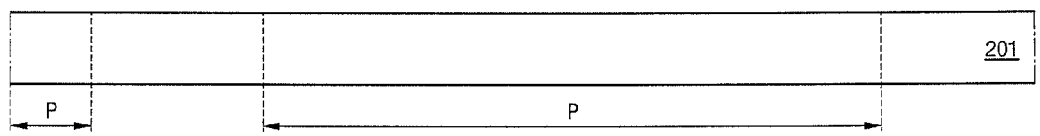
FIG. 12A to 12F are cross-sectional views illustrating processes of fabricating a portion of an array substrate shown in FIG. 10.

As shown in FIGS. 11A and 12A, the data line 205, the source electrode 210, and the drain electrode 213 are formed on the substrate 201. The substrate 201 may be a flexible substrate such as the plastic plate. A first metal layer (not shown) is formed on the substrate 201 by sputtering a first metallic material. The process of sputtering may be performed under a temperature lower than 200° C. A photoresist (PR) layer is formed on the first metal layer, and a first mask having a transmissive area and a blocking area is disposed over the PR layer. The transmissive area has a light transmittance greater than the blocking area. PR patterns are formed on the first metal layer by exposing and developing the first PR layer using the first mask. The first metal layer exposed by the PR patterns is removed such that the data line 205 and the source and drain electrodes 210 and 213 are formed on the substrate 201. The source electrode 210 extends from the data line 210 and is separated from the drain electrode 213.

Figure 11B:
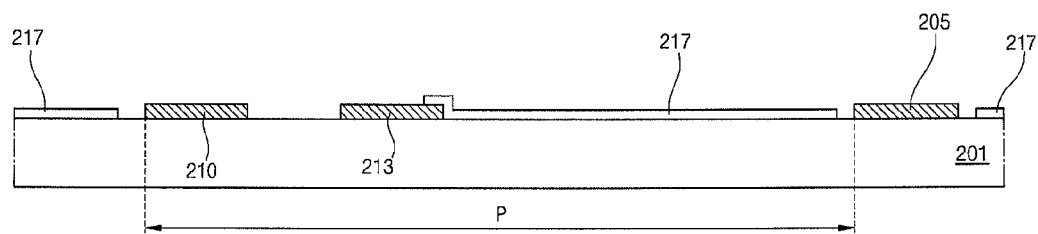
Figure 12B:
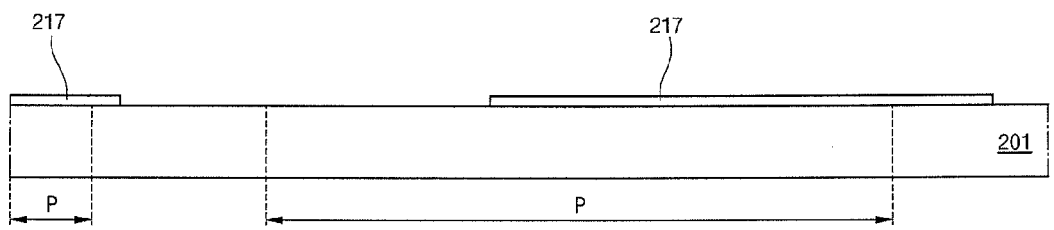

Next, as shown in FIGS. 11B and 12B, the pixel electrode 217 is formed in the pixel region "P" on the substrate 201 by depositing and patterning a transparent conductive metal layer by a mask process. The transparent conductive metal layer includes one of indium-tin-oxide (ITO) and indium-zinc-oxide (IZO). The pixel electrode 217 contacts the drain electrode 213.

Figure 11C:
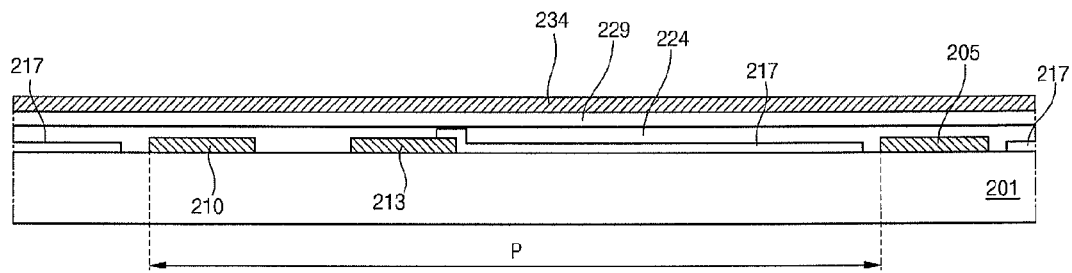
Figure 12C:
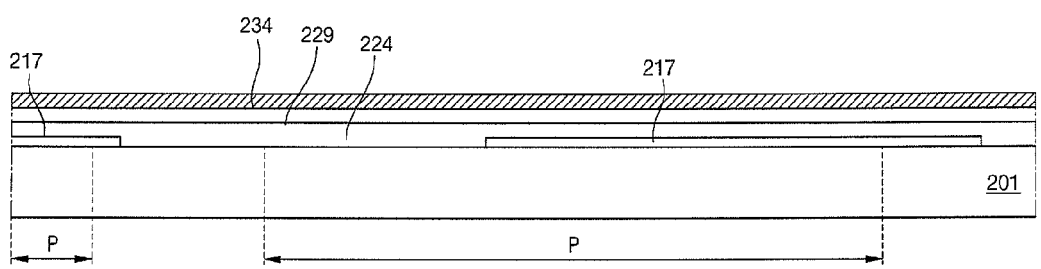

As shown in FIGS. 11C and 12C, an organic semiconductor material layer 224 is formed on the data line 205, the source and drain electrodes 210 and 213, and the pixel electrode 217 by coating an organic semiconductor material of a liquid phase using a coating device. The organic semiconductor material of a liquid phase includes one of pentacene and polythiophene. The coating device may be one of an ink-jet device, a nozzle type coating device, a bar type coating device, a slit type coating device, and a spin type coating device.

Sequentially, a gate insulating material layer 229 and a second metal layer 234 are formed on the organic semiconductor material layer 224. The gate insulating material layer 229 is formed on the organic semiconductor material layer 224 by depositing an organic insulting material such as photo-acrylate and poly(vinylalcohol). The second metal layer 234 is formed on the gate insulating material layer 229 by depositing a second metallic material. The second metallic material includes one of molybdenum (Mo), chromium (Cr), and Mo—Cr alloy. It is possible to pattern them by dry etching.

Figure 11D:
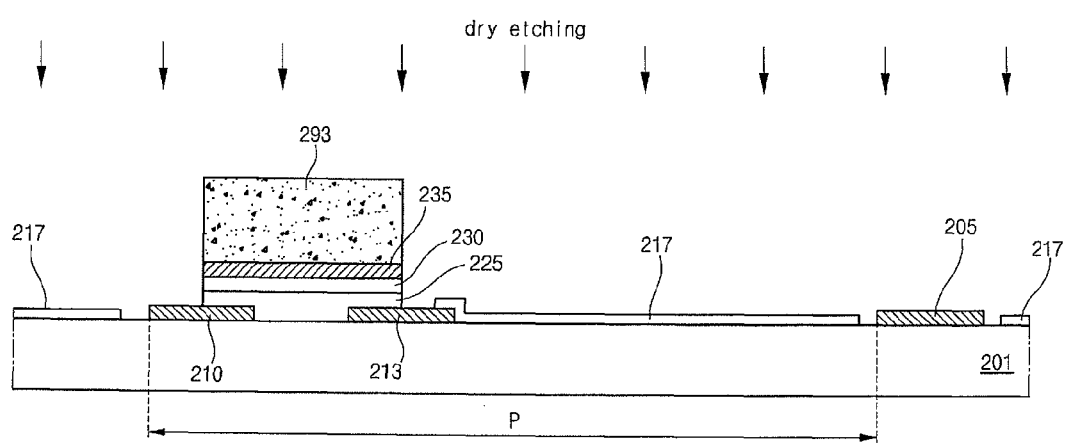
Figure 12D:
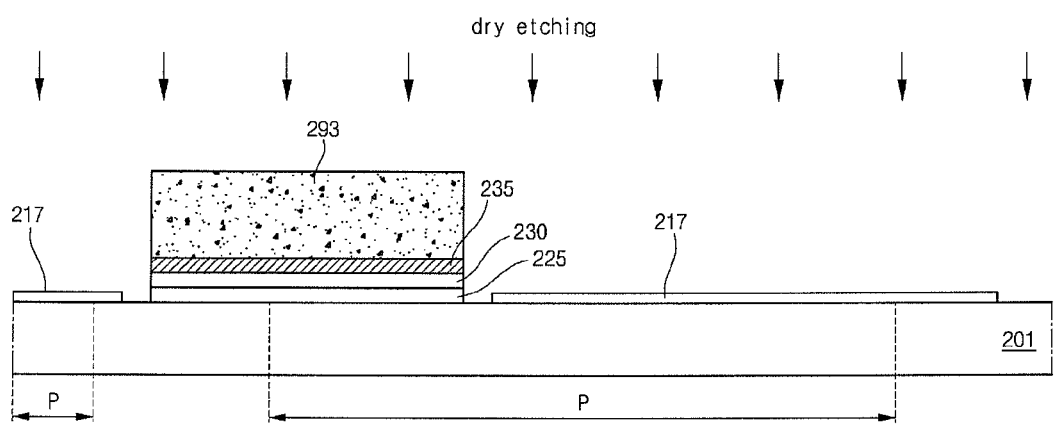

Next, as shown in FIGS. 11D and 12D, a first PR pattern 293 is formed on the second metal layer 234 (of FIGS. 11C and 12C) by depositing and patterning a first PR layer (not shown). Since the first PR pattern 293 is only formed on the second metal layer 234 (of FIGS. 11C and 12C), the first PR pattern 293 has an island shape. The gate electrode 235, the gate insulating layer 230, and the organic semiconductor layer 225 are formed on the source and drain electrodes 210 and 213. The gate electrode 235 is formed by removing the second metal layer 234 (of FIGS. 11C and 12C) exposed by the first PR pattern 293 using the first PR pattern as an etching mask. The organic semiconductor layer 225 contacts both of the source and drain electrodes 210 and 213. The gate insulating layer 230 is formed below the gate electrode 235 by removing the gate insulating material layer 229 (of FIGS. 11C and 12C) exposed by removing the second metal layer 234 (of FIGS. 11C and 12C). The organic semiconductor layer 225 is formed below the gate insulating layer 230 by removing the organic semiconductor material layer 224 (of FIGS. 11C and 12C) exposed by removing the gate insulating material layer 229 (of FIGS. 11C and 12C). The removing process may be performed by the dry etching. The second metal layer 234 (of FIGS. 11C and 12C), the gate insulating material layer 229 (of FIGS. 11C and 12C), and the organic semiconductor material layer 224 (of FIGS. 11C and 12C) are removed such that the pixel electrode 217 in the pixel region and the data line 205 are exposed. The first PR pattern 293 is subsequently removed.

Figure 11E:
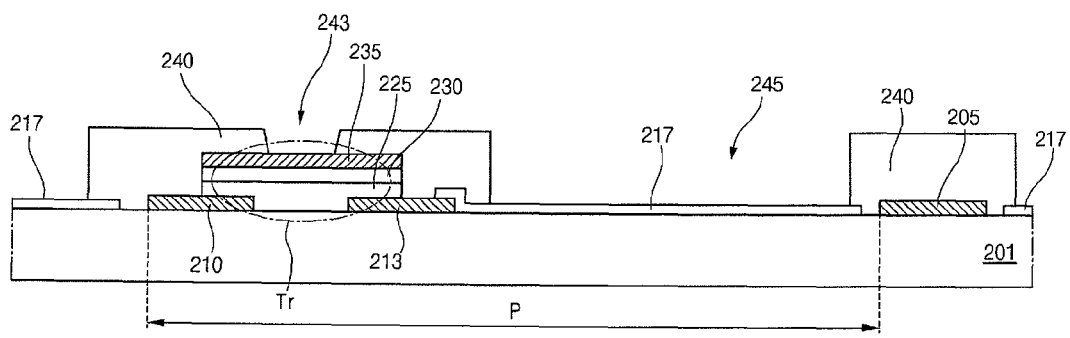
Figure 12E:
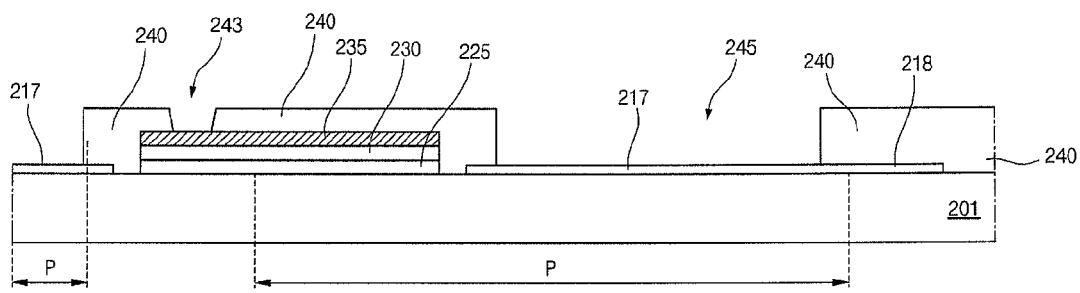

As shown in FIGS. 11E and 12E, the passivation layer 240 is formed on the gate electrode 235 and the data line 205 by depositing and pattering the organic insulating material such as such as photo-acrylate and poly(vinylalcohol). The passivation layer 240 includes the gate contact hole 243 and preferably an opening portion 245. The gate contact hole 243 partially exposes the gate electrode 235, and the opening portion 245 exposes the pixel electrode 217 in the pixel region "P". When the passivation layer 240 does not have the opening portion 245, an electric field between the pixel electrode 217 and a common electrode (not shown) of another substrate facing the substrate 201 is waned because of the passivation layer between the pixel electrode 217 and the common electrode (not shown). As a result, it requires high power consumption for driving the LCD device. The passivation layer 240 includes a data pad contact hole (not shown) exposing an end of the data line 205.

Since the passivation layer 240 is formed of a photosensitive organic insulating material such as photo-acrylate and poly(vinylalcohol), the passivation layer 240 is directly patterned without a photoresist layer. However, when the passivation layer 240 is formed of non-photosensitive organic insulating material such as benzo-cyclo-butane, the passivation layer is patterned using a photoresist layer. Since the passivation layer and the gate electrode cover the organic semiconductor layer, the organic semiconductor layer does not deteriorate when the passivation layer 240 is patterned using the photoresist layer by wet etching. Moreover, since it is possible to pattern the passivation layer of benzo-cyclo-butane by dry etching, the organic semiconductor layer does not deteriorate even if the organic semiconductor layer has damages.

Figure 11F:
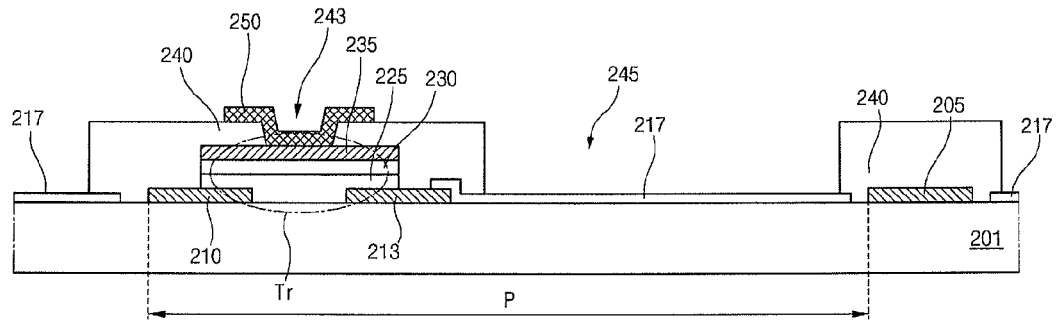
Figure 12F:
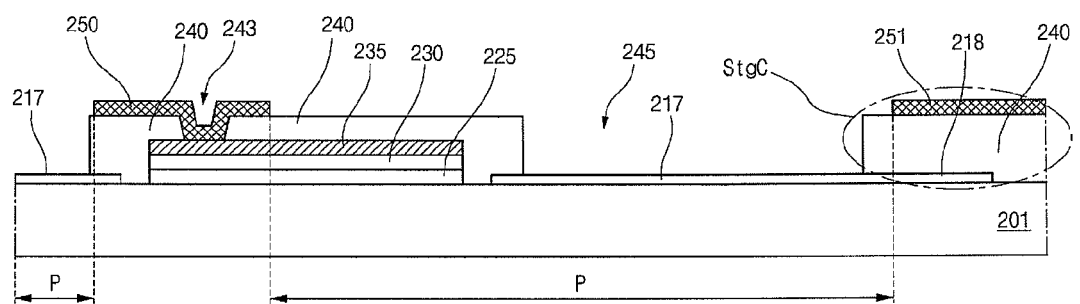

Next, as shown in FIGS. 11F and 12F, the gate line 250 is formed on the passivation layer 240 by depositing and patterning a low resistance metal layer (not shown). The low resistance metal layer may include one of aluminum, aluminum alloy, copper, copper alloy, and gold. The gate line 250 is electrically connected to the gate electrode 235 through the gate contact hole 243. The gate line 250 crosses the data line 205 such that the pixel region "P" is defined on the substrate 201. The gate line 250 partially overlaps the pixel electrode 217 such that the storage capacitor "StgC" is formed on the substrate 201. The storage capacitor "StgC" includes the pixel electrode 217 as a first storage electrode 218, the gate line 250 as a second storage electrode 251, and the passivation layer 240 between the pixel electrode 217 and the gate line 250 as a dielectric substance.

A second passivation layer (not shown) may be formed on the gate line 250 as a protection layer for the gate line 250. The second passivation layer includes a gate pad contact hole (not shown) exposing an end of the gate line 250. Although the second passivation layer is not shown in FIGS. 11F and 12F, FIG. 14 shows the second passivation layer 260. In FIG. 14, a gate pad 252 is disposed at one end of the gate line. For example, the gate pad 252 occupies the one end of the gate line. The second passivation layer 260 includes a gate pad contact hole 262 exposing the gate pad 252.

FIGS. 13A to 13F are cross-sectional view illustrating a process of fabricating an array substrate for an LCD device having an organic semiconductor pattern without causing damage to the organic semiconductor pattern according to another embodiment of the present invention.

First, a buffer layer (not shown) is preferably formed on the substrate by depositing an inorganic material. The inorganic material has a hydrophilic property and a good adhesive property to the substrate. The inorganic material may include silicon oxide.

Figure 13A:
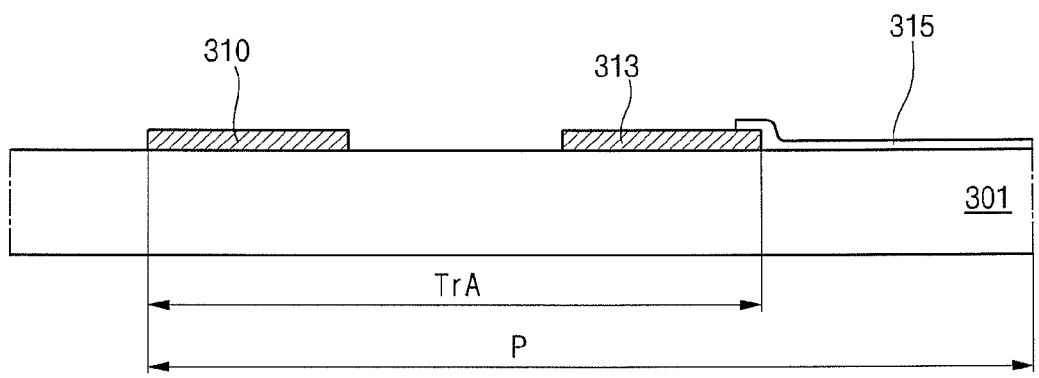
FIGS. 13A to 13G are cross-sectional view illustrating a process of fabricating an array substrate for an LCD device having an organic semiconductor pattern without causing damage to the organic semiconductor pattern according to one embodiment of the present invention.

Next, as shown in FIG. 13A, the source and drain electrodes 310 and 313 are formed on the substrate 301 by depositing and patterning a first metal layer (not shown). The substrate 301 includes the pixel region "P" and the switching region "TrA" in the pixel region "P". The source and drain electrodes 310 and 313 are formed on the switching region "TrA" and separated from each other. The first metal layer (not shown) includes a low resistant metallic material, such as gold (Au), copper (Cu), copper alloy, aluminum (Al), aluminum alloy (AlNd) and so on. At the same time, the data line (not shown) is formed on the substrate 301. The source electrode 310 extends from the data line (not shown).

Then, the pixel electrode 315 is formed on the substrate 301 in the pixel region "P" by depositing and pattering the transparent conductive material, such as ITO and IZO. The pixel electrode 315 directly contacts the drain electrode 313.

Figure 13B:
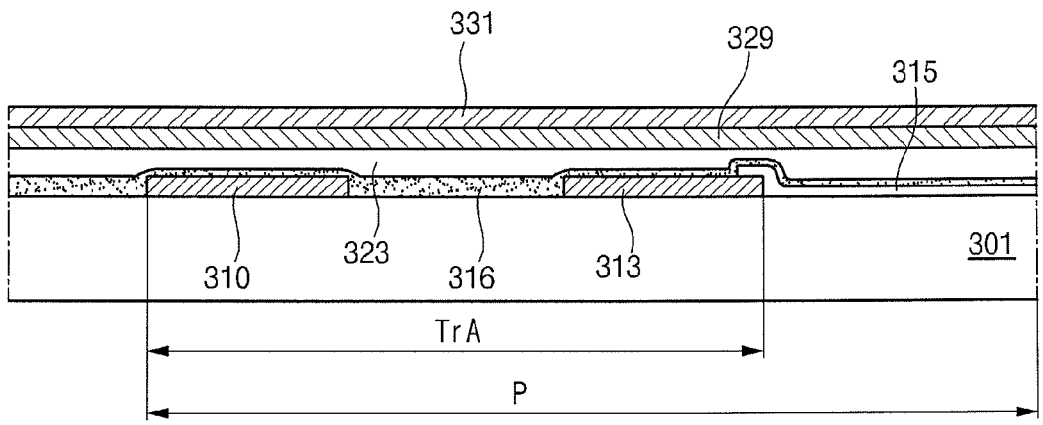

Next, as shown in FIG. 13B, the organic semiconductor material layer 316 is formed on the substrate 301 including the source and drain electrodes 310 and 313, the data line (not shown) and the pixel electrode 315 by depositing the organic semiconductor material of the liquid phase. The organic semiconductor material may be a low molecular organic semiconductor material having a good mobility, such as pentacene and polythiophene. The organic semiconductor material is deposited by using one of an ink-jet device, a nozzle coating device, a bar coating device, a slit coating device, a spin coating device, a printing device and so on.

Then, the gate insulating material layer 323, the second metal layer 329 and a third metal layer 331 are sequentially formed on the organic semiconductor material layer 316. The gate insulating material layer 323 includes the organic insulating material, such as poly(vinylalcohol) and fluoropolymer. The second metal layer 329 includes a second metallic material, such as Mo and Cr. The second metallic material has a dry-etchable property. The third metal layer 331 includes a third metallic material, such as Al, AlNd, Cu, copper alloy and Ag. The third metallic material is etched by using an etchant, which does not affect the second metal layer 329.

Figure 13C:
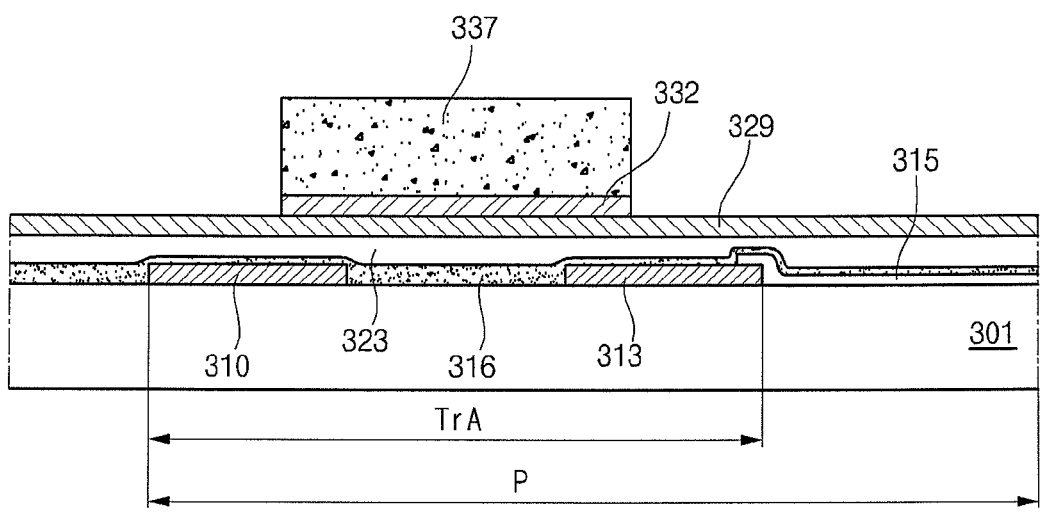

Next, as shown in FIG. 13C, a photosensitive pattern 337 is formed on the third metal layer 331 (of FIG. 13B) by depositing and patterning a photosensitive material layer including one of a photoresist material and photoacryl. The photosensitive pattern 337 corresponds to a center of the switching region "TrA". In other words, the photosensitive pattern 337 corresponds to a region between the source and drain electrodes 310 and 313, a part of the source electrode 310 and a part of the drain electrode 313. Then, the third metal layer 331 (of FIG. 13B) exposed by the photosensitive pattern 337 is removed such that the third metal pattern 332 is formed from the third metal layer 331 (of FIG. 13B) and the second metal layer 329 is exposed. The third metal layer 331 (of FIG. 13B) may be removed by a wet-etching process using an etchant.

Figure 13D:
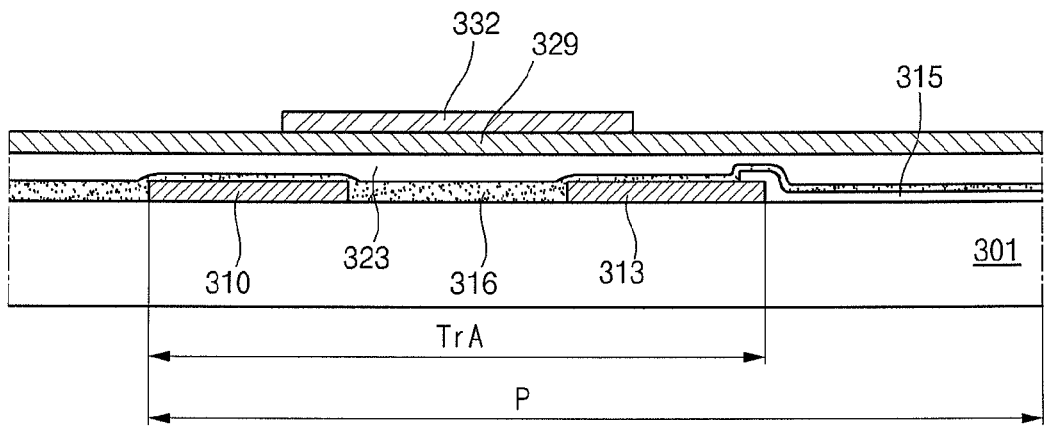

Next, as shown in FIG. 13D, the photosensitive pattern 337 (of FIG. 13C) is removed by a stripping process. The substrate 301 including the organic semiconductor material layer 316 is exposed to a stripping solution during the stripping process. However, since the organic semiconductor material layer 316 is covered by the gate insulating material layer 323 and the second metal layer 329, a property of the organic semiconductor layer does not deteriorate.

Since the dry-etching process is not performed on the photosensitive pattern 327 (of FIG. 13B), the photosensitive pattern 327 (of FIG. 13B) may be removed by an ashing process. When the photosensitive pattern 327 (of FIG. 13B), on which the dry-etching process has been performed, is removed by the ashing process, there is a problem due to remains of the photosensitive pattern 327 (of FIG. 13B).

Figure 13E:
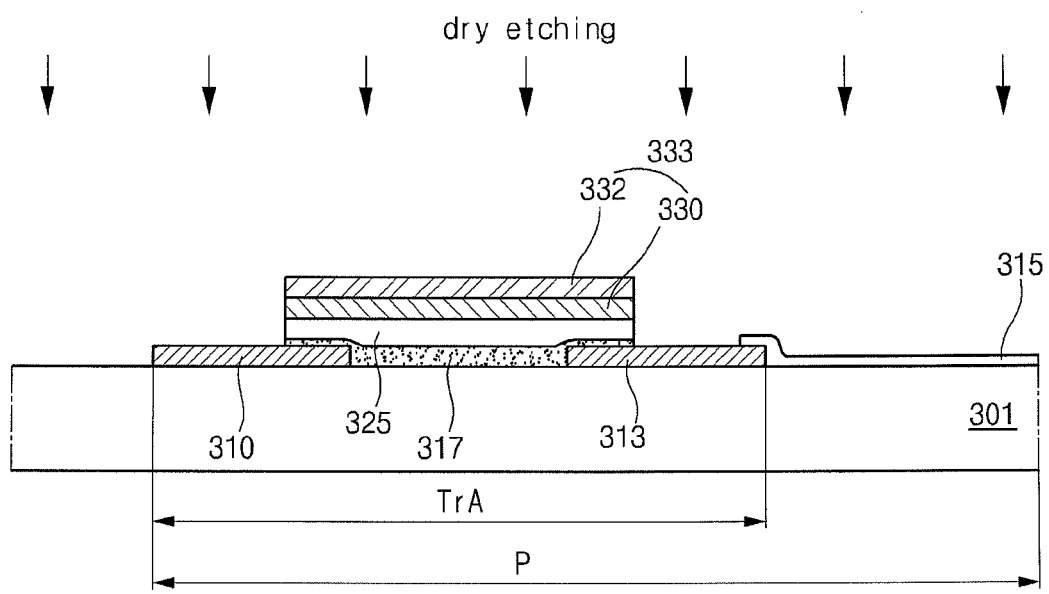

Next, as shown in FIG. 13E, the second metal layer 329 (of FIG. 13D) exposed by the third metal pattern 332, the gate insulating material layer 323 (of FIG. 13D) and the organic semiconductor material layer 316 (of FIG. 13D) are sequentially removed by a anisotropic dry-etching process using the third metal pattern 332 as a mask. As a result, a second metal pattern 330, the gate insulating layer 325 and the organic semiconductor layer 317 is sequentially formed on the source and drain electrodes 310 and 313. The second metal pattern 330, the gate insulating layer 325 and the organic semiconductor layer 317 has a same pattern as the third metal pattern 332. The third metal pattern 332 and the second metal pattern 330 constitute the gate electrode 333.

Figure 13F:
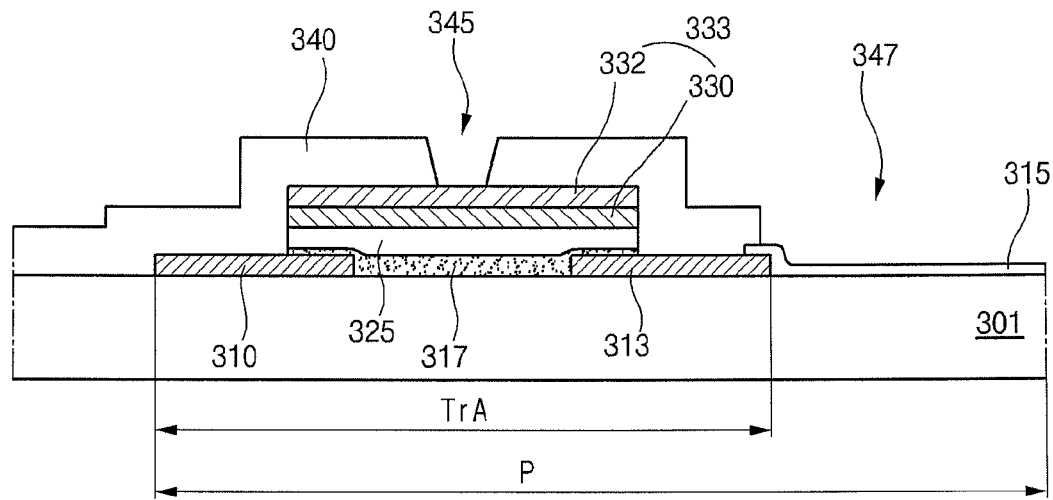

Next, as shown in FIG. 13F, the passivation layer 340 including the gate contact hole 345 and the opening portion 347 is formed on the gate electrode 333 by depositing and patterning a photosensitive organic insulating material, such as photovinylalcohol and photoacryl. The gate contact hole 345 exposes the gate electrode 333, and the opening portion 347 exposes the pixel electrode 315 in the pixel region "P". Since the organic semiconductor layer 317 is covered by the passivation layer 340 during the pattering process of the passivation layer 340, the organic semiconductor layer 317 is not damaged.

Figure 13G:
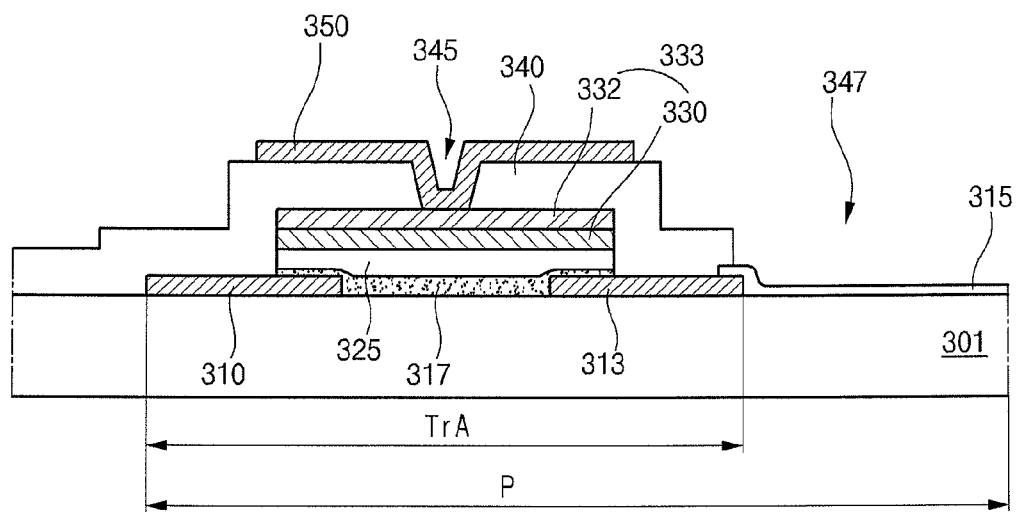

Next, as shown in FIG. 13G, the gate line 350 is formed on the passivation layer 340 by depositing and pattering a fourth metal material layer (not shown). The fourth metal material layer (not shown) includes a fourth metal material of a low resistant property, such as Al, AlNd, Cu, copper alloy and Ag. The gate line 350 is connected to the gate electrode 333 through the gate contact hole 345. The gate line 350 crosses the data line (not shown) to define the pixel region "P". An additional passivaton layer (not shown) may be formed on the gate line 350.

What is claimed is:

1. A method of fabricating an array substrate for a liquid crystal display device, the method comprising:
    forming a data line, a source electrode, and a drain electrode on a substrate that has a pixel region by depositing and patterning a data metal layer, wherein the source electrode extends from the data line and is separated from the drain electrode;
    depositing a transparent conductive metal layer on the substrate, wherein the transparent conductive metal layer contacts the drain electrode;
    patterning the transparent conductive metal layer to form a pixel electrode in the pixel region that contacts the drain electrode;
    forming an organic semiconductor layer, a gate insulating layer, and a gate electrode of a first metallic material on the substrate, wherein the organic semiconductor layer, the gate insulating layer, and the gate electrode have a substantially same shape;
    forming a first passivation layer of a photosensitive organic insulating material that has a gate contact hole on the gate electrode, wherein the gate contact hole exposes the gate electrode; and
    forming a gate line of a second metallic material on the first passivation layer, wherein the gate line contacts the gate electrode through the gate contact hole and crosses the data line to define the pixel region,
    wherein the pixel electrode lies below the first passivation layer.

2. The method according to claim 1, wherein the step of forming the organic semiconductor layer, the gate insulating layer, and the gate electrode comprises:
    sequentially forming an organic semiconductor material layer, a gate insulating material layer, and a first metal layer on the data line, the source electrode, the drain electrode, and a pixel electrode;
    forming a photoresist pattern on the first metal layer, wherein the photoresist pattern corresponds to the source electrode, the drain electrode, and a region between the source and drain electrodes;
    removing the first metal layer exposed through the photoresist pattern, the gate insulating material layer, and the organic semiconductor material layer below the first metal layer by dry etching; and
    removing the photoresist pattern.

3. The method according to claim 1, wherein the first passivation layer further includes an opening portion that exposes the pixel electrode.

4. The method according to claim 1, wherein the step of forming a first passivation layer includes forming a data pad contact hole that exposes an end of the data line.

5. The method according to claim 1, wherein a previous gate line overlaps the pixel electrode such that the first passivation layer is disposed between the previous gate line and the pixel electrode.

6. The method according to claim 1, further comprising forming a second passivation layer that has a gate pad contact hole on the gate line, the gate pad contact hole exposing an end of the gate line.

7. The method according to claim 1, wherein the organic semiconductor layer, the gate insulating layer, and the gate electrode have the same shape as one another when viewed from above and perfectly overlap with one another.

8. The method according to claim 1, wherein the step of forming the organic semiconductor layer includes depositing an organic semiconductor material using one of an ink-jet device, a nozzle type coating device, a bar type coating device, a slit type coating device, and a spin type coating device.

9. The method according to claim 1, further comprising forming a buffer layer between the substrate and the organic semiconductor layer.

10. The method according to claim 1, wherein the first metallic material includes one of molybdenum, chromium, and molybdenum-chromium alloy.

11. The method according to claim 1, wherein the organic semiconductor layer includes one of pentacene and polythiophene.

12. The method according to claim 1, wherein the gate insulating layer includes one of photo-acrylate and poly(vinylalcohol).

13. The method according to claim 1, wherein the second metallic material includes one of aluminum, aluminum alloy, copper, copper alloy, and gold.

14. A method of fabricating an array substrate for a liquid crystal display device, the method comprising:
    forming a data line, a source electrode, a drain electrode on a substrate that has a pixel region, wherein the source electrode extends from the data line and is separated from the drain electrode;
    forming a pixel electrode in the pixel region that contacts the drain electrode;
    sequentially forming an organic semiconductor material layer, a gate insulating material layer, a first metal layer and a second metal layer on the substrate, the drain electrode and the pixel electrode, wherein the first and second metal layers include different metallic materials;
    wet-etching the second metal layer to form a first metal pattern;
    dry-etching the first metal layer, the gate insulating material layer and the organic semiconductor material layer to form a second metal pattern, the gate insulating layer and the organic semiconductor layer, wherein the first metal layer, the gate insulating material layer and the organic semiconductor material layer are patterned using the first metal pattern as a patterning mask;
    forming a first passivation layer that includes a gate contact hole on the first metal pattern, the gate contact hole exposing the first metal pattern; and
    forming a gate line on the first passivation layer, the gate line contacting the first metal pattern through the gate contact hole and crossing the data line to define the pixel region.

15. The method according to claim 14, wherein the step of forming the first metal pattern includes:
    forming a photosensitive material layer on the second metal layer;

forming a photosensitive pattern by patterning the photosensitive material layer;

removing the second metal layer exposed by the photosensitive pattern; and removing the photosensitive pattern.

16. The method according to claim 15, wherein the step of removing the photosensitive pattern includes one of a stripping process and an ashing process.

17. The method according to claim 14, wherein the first passivation layer further includes an opening portion exposing the pixel electrode.

18. The method according to claim 14, wherein the first passivation layer is formed of a photosensitive material including one of polyvinylalcohol and photoacryl, such that the first passivation layer is patterned to have the gate contact hole in the absence of a photoresist layer.

19. The method according to claim 14, wherein the step of forming the organic semiconductor material layer includes depositing an organic semiconductor material using one of an ink-jet device, a nozzle type coating device, a bar type coating device, a slit type coating device, and a spin type coating device.

20. The method according to claim 14, further comprising forming a buffer layer between the substrate and the organic semiconductor layer.

21. The method according to claim 14, wherein the organic semiconductor layer includes one of pentacene and polythiophene.

22. The method according to claim 14, wherein the gate insulating layer includes one of photo-acrylate and poly(vinylalcohol).

23. The method according to claim 14, wherein the first metal layer includes one of molybdenum, chromium and molybdenum-chromium alloy.

24. The method according to claim 14, wherein the second metal layer includes one of aluminum, aluminum alloy, copper, copper alloy and gold.

25. The method according to claim 14, wherein the first passivation layer includes a data pad contact hole that exposes the data line.

26. The method according to claim 14, further comprising forming a second passivation layer on the gate line.

27. The method according to claim 14, wherein the organic semiconductor layer, the gate insulating layer, the first metal pattern and the second metal pattern have the same shape as one another when viewed from above and perfectly overlap with one another.

28. The method according to claim 14, wherein the first passivation layer includes one of polyvinylalcohol and photoacryl.

29. The method according to claim 14, wherein the organic semiconductor layer is disposed on the source and drain electrode and the gate insulating layer and a gate electrode including the first and second metal patterns are sequentially disposed on the organic semiconductor layer.

* * * * *